(12) United States Patent
Werhane et al.

(10) Patent No.: US 10,410,994 B2
(45) Date of Patent: Sep. 10, 2019

(54) SINGLE INTERCONNECT INDEX POINTER FOR STACKED DIE ADDRESS ENCODING

(71) Applicant: Micron Technology, Inc., Boise, ID (US)

(72) Inventors: Kevin Gustav Werhane, Kuna, ID (US); Jason M. Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 15/705,867

(22) Filed: Sep. 15, 2017

(65) Prior Publication Data

US 2019/0086469 A1  Mar. 21, 2019

(51) Int. Cl.
*H01L 25/065* (2006.01)
*G01R 31/28* (2006.01)
*G01R 31/3177* (2006.01)
*H03K 19/20* (2006.01)

(52) U.S. Cl.
CPC ...... *H01L 25/0657* (2013.01); *G01R 31/2896* (2013.01); *G01R 31/3177* (2013.01); *H01L 2225/06544* (2013.01); *H03K 19/20* (2013.01)

(58) Field of Classification Search
CPC ...... H01L 25/0657; H01L 2225/06544; H03K 19/20; G01R 31/2896; G01R 31/3177
See application file for complete search history.

(56) References Cited

U.S. PATENT DOCUMENTS

2005/0082664 A1\* 4/2005 Funaba ............... H01L 23/544
257/724
2011/0148469 A1\* 6/2011 Ito ............................ G11C 5/04
327/77

\* cited by examiner

*Primary Examiner* — Ajay Ojha
(74) *Attorney, Agent, or Firm* — Schwegman Lundberg & Woessner, P.A.

(57) ABSTRACT

Techniques for using a single thru-chip signal path to auto-identify and address each integrated circuit within a stack of integrated circuits upon power-up of stack. In an example, each integrated circuit of the stack can include a single auto-identify input terminal, a single auto-identify output terminal, and control logic configured to receive a logic state on the single auto-identify input terminal, to set an internal indicator to one of three states, and to control a state of the single auto-identify output terminal in response to a power up condition or to a change in the logic state of the single auto-identify input terminal.

22 Claims, 4 Drawing Sheets

SINGLE INTERCONNECT INDEX POINTER FOR STACKED DIE ADDRESS ENCODING

BACKGROUND

Stacked integrated circuits (ICs) have become a common package technique to increase processing and storage density of various electronic devices. Progress in miniaturizing various circuits and components has further allowed stacked integrated packages to become even more desired. However, miniaturizing has also created tradeoffs between size and function because the reduced size limits interconnect real estate. Thus, more processing chips or storage chips in the stack usually means significantly larger packages to accommodate additional interconnect real estate for the added chips. In addition, either significant processing such that each stacked chip is properly identified by the system or custom chips for each level of the stack may be necessary.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Thru chip interconnects, such as but not limited to, through silicon vias (TSVs) and thru chip connection pins, can be used to address, command and exchange data with a stack of ICs. In conventional methods, each chip in the stack is allocated real estate to provide one or more auto-identify interconnections. In order to provide a standard chip that can be used at any level within the stack of ICs, each chip must provide real estate for however many TSV-type signal paths may be needed for the auto-identification function of the assembled stack of ICs.

An auto-identify function can be initiated as one of the first test functions of an assembled stack of ICs. An auto-identify function can assign the logical addresses of each of the stacked ICs by automatically detecting the true physical stack-die location of each stacked IC. In conventional techniques, the number of TSVs, or thru-chip signal paths, assigned to accommodate the auto-identify function is a function of the number of layers (L) or the number of ICs in the stacked package. For example, a "ladder" auto-identify technique generally can require assignment of L−1 TSVs for the auto-identify function and an "adder" auto-identify technique generally can require ln[L]/ln[2] TSVs for the auto-identify function, where L equals the number of ICs or layers in the stack of ICs. In addition, conventional auto-identify techniques add complexity that as of yet has not proven to be robust. In addition, once all the auto-identify TSV connections of a design have been used, creating a new, stacked, IC package with additional layers of ICs can require a new design or some other resource intensive effort to accommodate an auto-identify sequence for the added IC(s).

The present inventors have recognized various techniques for auto-identifying a stack of ICs using a single auto-identify input and a single auto identify output such that the area required to accommodate TSVs for the auto-identify function is reduced to the area for a single thru-chip signal path, or TSV, on each IC of the stack of ICs. It is submitted that the new techniques simplify the auto-identification function and provides scalability without the need for re-design based on the auto-identify function. In certain examples, a design of a stack of IC need only reserve real estate for a single through chip interconnect, common to each IC of the stack, to allow for a stack of, theoretically, an unlimited number of ICs. In certain examples, one of the limiting factors to the number of ICs that may be used in a stack is the width of the address bus of the package. In certain examples, the auto-identify circuitry used after the package is assembled can be identical in each IC of the stack of ICs in the package.

Figure 1:
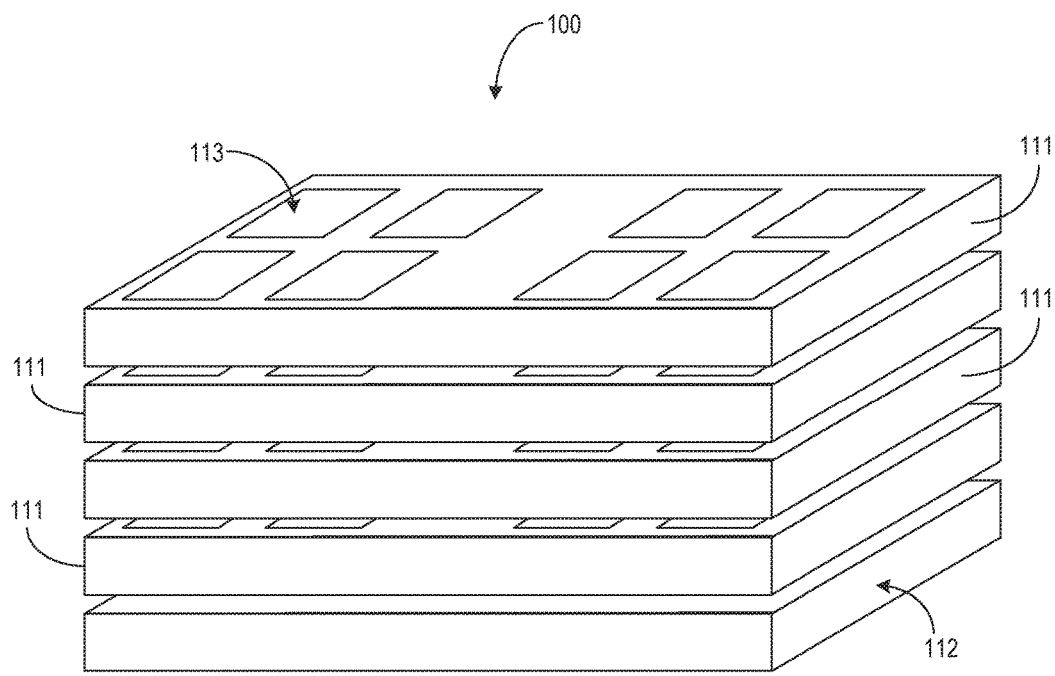
FIG. 1 illustrates generally a stacked integrated circuit (IC) package.

FIG. 1 illustrates generally a stacked IC package 100. The stacked IC package 100 can include a plurality of ICs, 111, 112 arranged in a stack such that each IC forms a level of the stack. In certain examples, the stacked IC package 100 can form, but is not limited to, a memory device having an interface IC 112 and multiple memory ICs 111. Each memory IC 111 can include multiple memory arrays 113.

Figure 2:
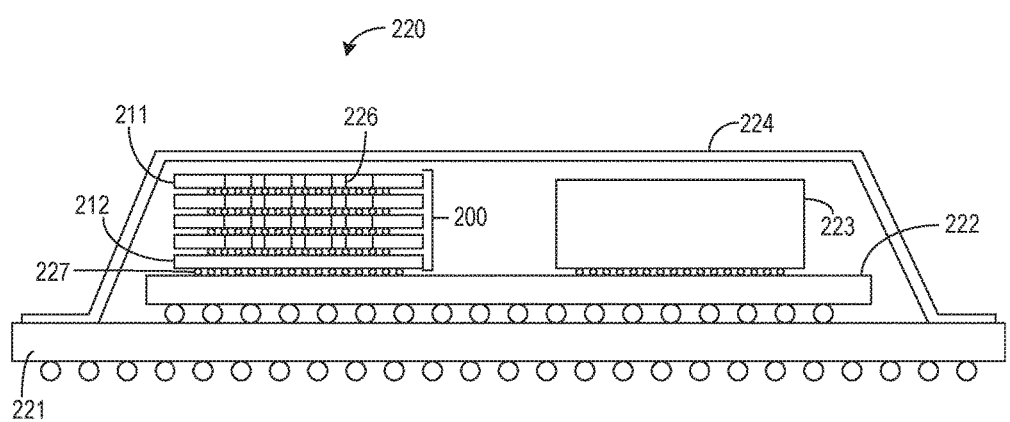
FIG. 2 illustrates generally an example memory package.

FIG. 2 illustrates generally an example memory package 220. In certain examples, the memory package 220 can include a package substrate 221, an interposer 222, a memory controller 223, a memory subsystem 200 and a housing 224. The package substrate 221 can provide a base structure upon which the other components of the memory package 220 can be mounted. The package substrate 221 can also provide electrical connections to external components. The interposer 222 can provide external signal routing between the package substrate 221 and each of the memory subsystem 200 and the memory controller 223. The interposer 222 can also provide internal signal routing between the memory controller 223 and the memory subsystem 200. The housing 224 can protect the components of the memory package 220. The memory subsystem 200 can include a stack of ICs, such as a stack of memory circuits 211 and a memory interface circuit 212. In certain examples, signals can be passed between the stacked circuits using through silicon (or substrate) vias 226 (TSV) or connection pins. In certain examples, each IC of the stack of ICs can be electrically and mechanically mounted to an adjacent circuit or the interposer 222 using micro-bumps 227.

Figure 3:
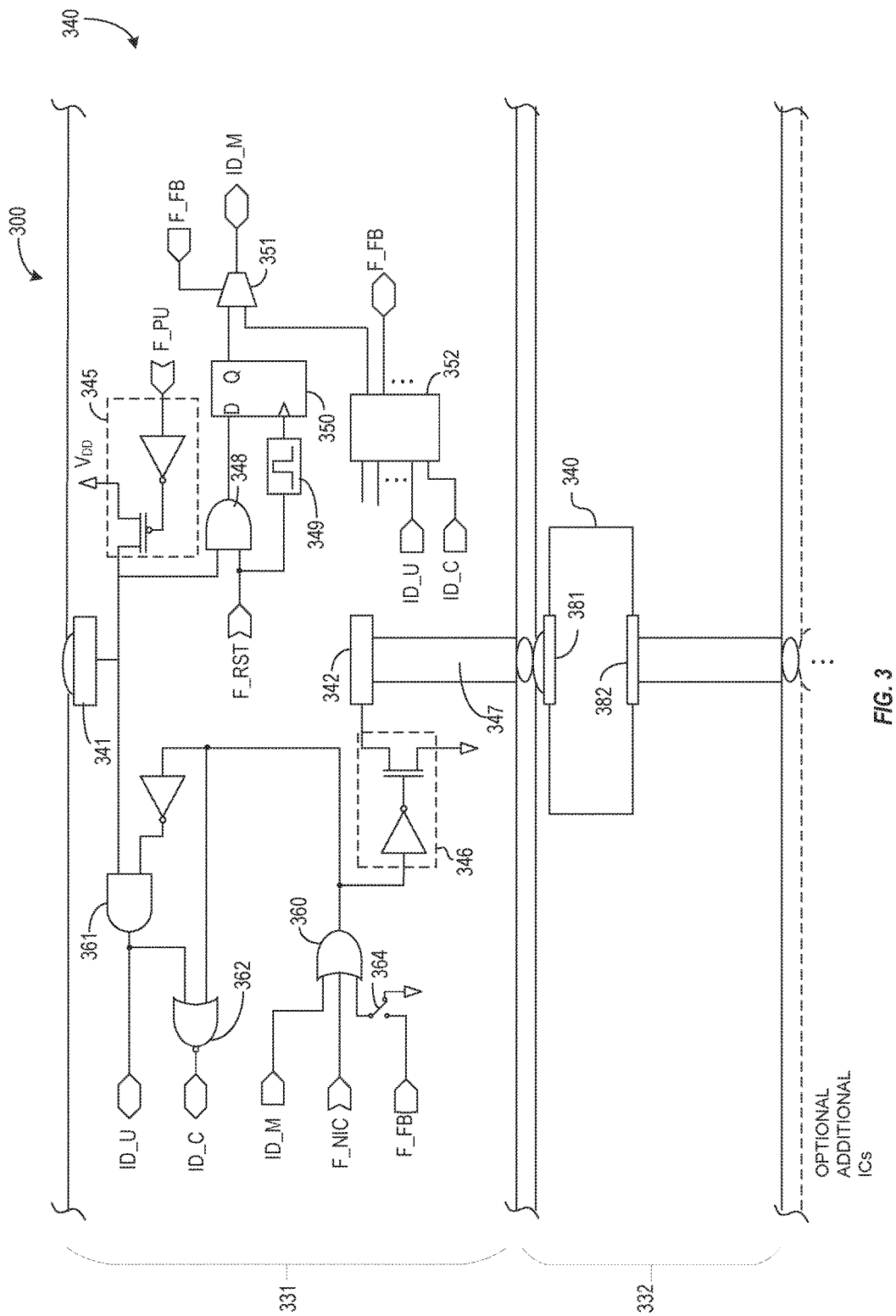
FIG. 3 illustrates generally a portion of a stack of ICs and details of an example auto-identify circuit of one of the ICs.

FIG. 3 illustrates generally a portion of a stack 300 of ICs 331, 332 and details of an example auto-identify circuit 340 of one of the ICs 331, 332. In certain examples, the auto-identify circuit 340 for each of the ICs 331, 332 in the stack 300 can include a single TSV, or real estate equivalent to a single TSV, for detecting and assigning a logical stack-location address of the IC during the auto-identify function. The portion of the stack 300 includes a first IC 331 and a second IC 332. The first IC 331 can be an IC at, for example, the top of the stack 300 such that the auto-identify input 341 of the first IC 331 is not connected to another IC. The second IC 332 can be located immediately below the first IC 331. The auto-identify input 381 of the second IC 332 can be coupled to the auto-identify output 342 of the first IC. Optionally, additional ICs can be located below the second IC 332. Also, it is understood that designation of top, bottom, below, etc. is for clarity of description and that it is possible that the stack of ICs can be arranged with a different orientation without departing from the scope of the present subject matter.

FIG. 3 illustrates generally an example auto-identify circuit 340 of the second die 332, and a more detailed version of the auto-identify circuit 340 of the first die 331. In certain examples, the auto-identify circuit 340 of the first IC 331 and the auto-identify circuit 340 of the second IC 332 are identical. In certain examples, the first IC 331 and second IC 332 can be identical by virtue of being the same IC model or part number. The auto-identify circuit can include a pull-up circuit 345 coupled to the auto-identify input 341 and a pull-down circuit 346 coupled to the auto-identify output 342. In certain examples, one of the auto-identify input 341 or the auto-identify output 342 can be coupled to a TSV 347. Upon power-up of the stack 300 of ICs, the auto-identify output 342 of each IC of the stack 300 can be assumed to be pulled "low".

The state of the auto-identify input 341 can be used to control whether an IC of the stack 300 is identified as "master" IC of the stack 300 and assigned a "master" state (ID_M). In the illustrated example of the auto-identify circuit of FIG. 3, whichever IC in the stack of ICs that has the auto-identify input pulled "high" upon initial power-up (F_PU="high") of the stack 300, is assigned as the master IC of the stack 300. With regard to the first IC 331, upon power-up (F_PU="high"), the auto-identify input 341 can be pulled "high" because the auto-identify input 341 is not connected to any other external circuit. After a delay, for example to ensure power supplies levels are established and stable, a reset (F_RST="high") can be generated. In an example, a logic gate 348 can "and" the state of the auto-identify input 341 of the first IC 331 and the reset (F_RST), additional gates 349 of the power logic 343 can generate a pulse using the reset signal (F_RST), and an output of the logic gate 348 and the pulse can set an output of a latch 350 to indicate that the first IC 31 has been detected as the master IC and an internal indication can be assigned a "master" state (ID_M="high").

In certain examples, a multiplexer 351 of the power-up logic 343 can control the state of the internal indication. For the present discussion, it is assumed that no other operations have been conducted with the first IC 331 such that the multiplexer 351 passes the output of the latch 350 to other gates of, for example, the auto-identify circuit 340. If the above assumption cannot be made, the auto-identify circuit 340 can include a stack decoder 352 that can determine what signal is passed by the multiplexer 351. The stack decoder 352 can affect the control of the multiplexer 351 if prior operations have, for example, assigned a logical address to the first IC 331, or have utilized fuses (F_FB—any fuse blown flag) to assign an address to the IC 331.

Assuming the first IC 331 is assigned the "master" and the internal indication is assigned a "master" state (ID_M), the auto-identify circuit 340 can change the state of the auto-identify output 342 of the first IC 331. Upon initial start-up, an output of a second gate 360 of the auto-identify circuit 340 is "low". The output of that second gate 360 can pull the auto-identify output 342 of the first die "low" for example via an inverter and an output transistor of the pull-down circuit 346. Upon the internal indication being set to the "master" state (ID_M), the output of the second gate 360 can go "high", and the output transistor of the pull-down circuit 346 can be turned "off", releasing the auto-identify output 342 of the first IC 331 from being pulled "low". In summary, for the first IC 331, upon power-up, the auto-identify input 341 can be pulled "high", and the auto-identify output 342 can be pulled "low". Upon reset of the stack 300 or the first IC 331, the first IC 331 can be detected and assigned "master". Upon a short delay after being assigned "master", the auto-identify output 342 of the first IC 331 can be released from being pulled "low".

With regard to the second IC 332, which includes a replica of the auto-identify circuit 340 of the first IC 331, upon power-up (F_PU="high"), the auto-identify input 381 can be pulled "low" by the auto-identify output 342 of the first IC 331 and the auto-identify output 382 can be pulled 'low' because the output of the second gate 360 of the auto-identify circuit 340 is "low" upon power-up. A third gate 361 of the auto-identify circuit 340 can receive the "low" state of the auto-identify input 382 and can provide a "low" output state to a fourth gate 362 of the auto-identify circuit 340. The fourth gate 362 can assign the internal indication of the second IC as a "common" state (ID_C). Because the auto-identify input 381 of the second IC 332 is pulled "low" by the auto-identify output 342 of the first IC 331, the auto-identify circuit 340 of the second IC 332 does not affect the state of the internal indication of the second IC 332 upon receiving the reset (F_RST). The above sequence of setting the internal indication to a "common" state (ID_M) is also applicable to any additional optional ICs stacked below the second IC 332.

Referring again, specifically, to the second IC 332, a short delay after the reset (F-RST), the auto-identify output 342 of the first IC 331 can be released from being pulled "low", and the auto-identify input 381 of the second IC 332 can be allowed to be pulled "high" by the pull-up circuit 345 of the auto-identify circuit 340 of the second IC 332. In certain examples, the interaction between the pull-up circuit 345 of the second IC 332 and the pull-down circuit 346 of the first IC 331 is designed with a ratio such that if the pull-down circuit 346 is active, the pull-down circuit 346 can pull down the connection between stacked ICs harder than the corresponding pull-up circuit 345. In response to the auto-identify input 382 of the second IC 332 being pulled "high", the output of the third gate 361 of the auto-identify circuit 340 of the second IC 332 can go "high" and the output of the fourth gate 362 can go "low", thus, setting the internal indication to a "unique" state (ID_U). In certain examples, upon the second IC 332 being detected and assign a "unique" state (ID_U), the stack 300 can reach a stable post power-up state that can allow other equipment, such as test equipment, to begin testing and formatting the stack for potential use in a larger system. For example, in the stable post-power-up state, test equipment can individually address and command the first IC 331 (ID_M) and the second IC 332 (ID_U). Any remaining ICs (ID_C) in the stack 300 can be collectively addressed and commanded.

In addition to other tests, the test equipment can also begin to format the ICs with individual logical addresses for temporary use in testing or for more permanent use such as when the stack 300 is assembled into a larger system. For example, since the second IC 332, having the indicator set to a "unique" state (ID_U), the second IC 332 can be individually addressed and commanded. Thus, the internal indicator can act as a pointer to allow external equipment to test and format an individual IC of the stack 300 of ICs. One of the operations that external equipment can do to a "unique" IC of a stack, is format the IC with either a soft, temporary address, or with a hard, more permanent address separate from the internal indicator. Upon testing and/or formatting the second IC 332, the external equipment can provide a "next die" signal (F_ND), or command, to the second IC 332 or to the stack 300 of ICs. The third gate 361 of the auto-identify circuit 340 of the second IC 332 can go "high", thus, releasing the pull-down of the auto-identify output 382 of the second die and resetting the internal indicator of the second IC 332, via the third and fourth gates 361, 362, to a "common" state (ID_U). In addition, the release of the auto-identify output 382 can allow an additional IC located just below the second IC to set its internal indicator to the "unique" state (ID_U) and, thus, allow that additional IC to be individually tested, formatted, and assigned an individual logical address. Once all the ICs of the stack 300 have been assigned a unique, individual logical address, permanent fuses can be blown to prevent the auto-identify circuit from enabling addressing of the ICs using the state of the internal indication.

In certain examples, the state of the internal indicator can be a logical address of the IC. Thus, at the conclusion of the power-up of the newly assembled stack of ICs, the IC with an internal indicator set to the "master" state (ID_M) can be individually addressed by external equipment. In some examples, the remaining ICs of the stack 300 of ICs can have an internal indicator set to the "common" state (ID_C) and can be addressed as a block of ICs by external equipment. In some examples, upon completion of the power-up of the newly assembled stack of ICs, the auto-identify circuit can ensure that one of the ICs can be addressed as the "master", a second IC can be addressed as the "unique", and the remaining ICs of the stack can be addressed as "commons". In certain examples, the auto-identify circuit can include a switch 364 that can enable or disable whether the second gate relies on the fuse blown flag (F_FB) to control the state of the single auto-identify output.

Figure 4:
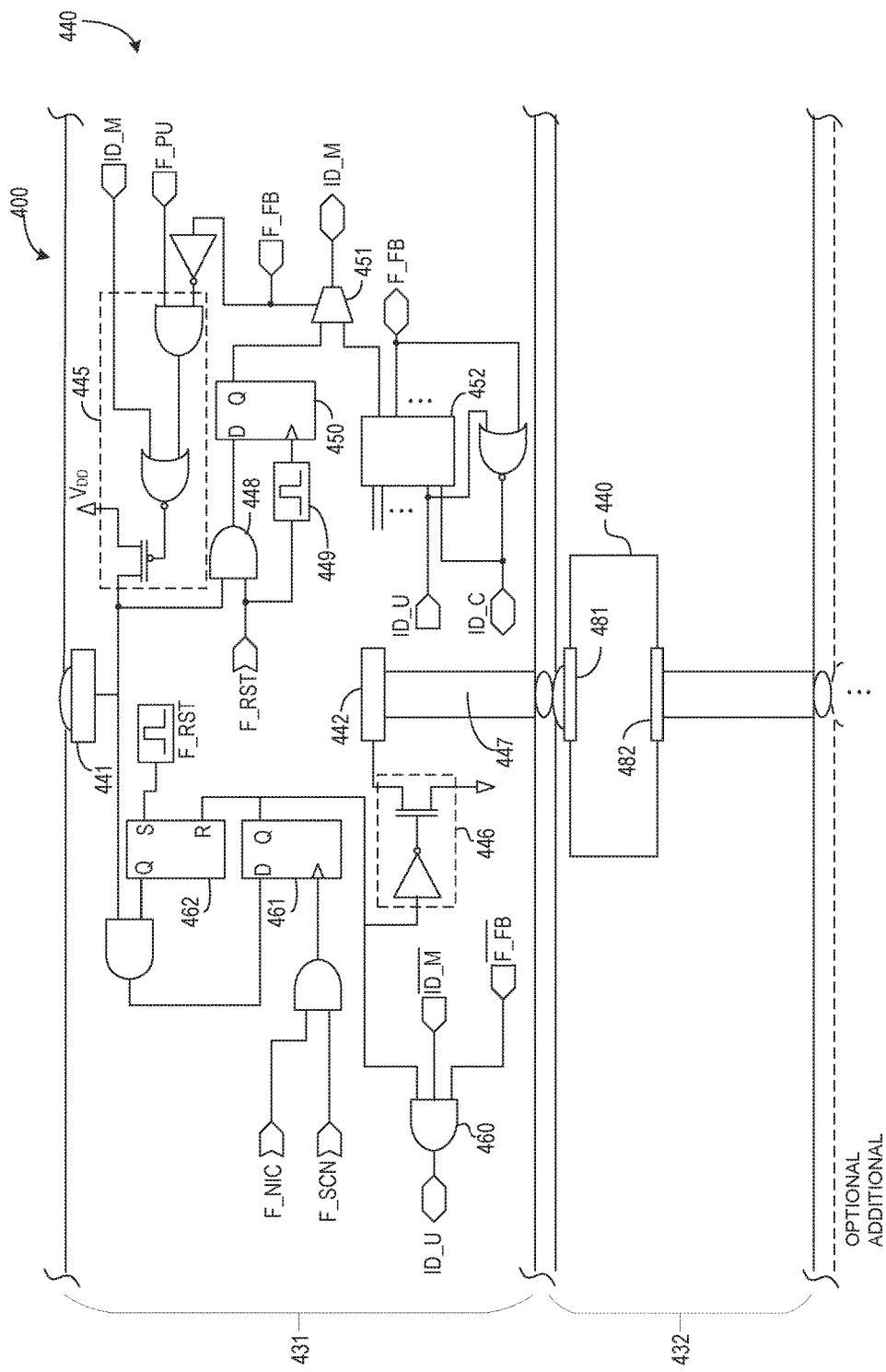
FIG. 4 illustrates generally a portion of a stack of ICs and details of an alternative example auto-identify circuit of one of the ICs.

FIG. 4 illustrates generally a portion of a stack 400 of ICs 431, 432 and details of an alternative example auto-identify circuit 440 of one of the ICs 431, 432. In certain examples, the auto-identify circuit 440 for each of the ICs 431, 432 in the stack 400 can include a single TSV, or real estate equivalent to a single TSV, for detecting and assigning a logical stack-location address of the IC during the auto-identify function. The portion of the stack 400 includes a first IC 431 and a second IC 432. The first IC 431 can be an IC at, for example, the top of the stack 400 such that the auto-identify input 441 of the first IC 431 is not connected to another IC. The second IC 432 can be located immediately below the first IC 431. The auto-identify input 481 of the second IC 432 can be coupled to the auto-identify output 442 of the first IC. Optionally, additional ICs can be located below the second IC 432. Also, it is understood that designation of top, bottom, below, etc. is for clarity of description and that it is possible that the stack of ICs can be arranged with a different orientation without departing from the scope of the present subject matter.

FIG. 4 illustrates generally an example auto-identify circuit 440 of the second die 432, and a more detailed version of the auto-identify circuit 440 of the first die 431. In certain examples, the auto-identify circuit 440 of the first IC 431 and the auto-identify circuit 440 of the second IC 432 are identical. In certain examples, the first IC 431 and second IC 432 can be identical by virtue of being the same IC model or part number. In certain examples, the auto-identify circuit 440 include a pull-up circuit 445 coupled to the auto-identify input 441 and a pull-down circuit 446 coupled to the auto-identify output 442. In certain examples, one of the auto-identify input 441 or the auto-identify output 442 can be coupled to a TSV 447. Upon power-up of the stack 400 of ICs, the auto-identify output 442 of each IC of the stack 400 can be assumed to be pulled "low".

The state of the auto-identify input of an IC of the stack 300 can be used to control whether an IC of the stack 400 is identified as "master" IC of the stack 400 and assigned a "master" state (ID_M). In the illustrated example of the auto-identify circuit of FIG. 4, whichever IC in the stack of ICs that has the auto-identify input pulled "high" upon initial power-up of the stack 400, is assigned as the master IC of the stack 400. With regard to the first IC 431, upon power-up, the auto-identify input 441 can be pulled "high" because the auto-identify input 441 is not connected to any other external circuit. After a delay, for example to ensure power supplies levels are established and stable, a reset can be generated. In an example, a logic gate 448 can "and" the state of the auto-identify input 441 of the first IC 431 and the reset, additional gates 449 of the auto-identify circuit 440 can generate a pulse using the reset signal, and an output of the logic gate 448 and the pulse can set an output of a latch 450 to indicate that the first IC 431 has been detected as the master IC and an internal indication has been assigned a "master" state (ID_M).

In certain examples, a multiplexer 451 of the auto-identify circuit 440 can control the state of the internal indication. For the present discussion, it is assumed that no other operations have been conducted with the first IC 431 such that the multiplexer 451 passes the output of the latch 450 to other gates of, for example, the auto-identify circuit 440. If the above assumption cannot be made, the auto-identify circuit 440 can include a stack decoder 452 that can determine what signal is passed by the multiplexer 451 The stack decoder 452 can affect the control of the multiplexer 451 if prior operations have, for example, assigned a logical address to the first IC 431.

Unlike the auto-identify circuits 340 of FIG. 3, detecting the master level IC and assigning the internal indicator of the first IC 431 to a "master" state does not in turn change a state of the pull-down circuit of the first IC 431. Consequently, a post power-up stable state of the stack 400, allows individual addressing of only the "master" IC as the rest of the ICs of the stack, including the second IC 432, have their internal indicator set to a "common" state (ID_C).

When the external equipment is ready to individually address the next IC, a "next IC" signal and a "scanCLK" signal can be received by the auto-identify circuit 440. Upon receiving the "next IC" and "scanCLK" signal at the auto-identify circuit 440 of the first IC 431, a second latch 461 of the auto-identify circuit 440 can release the pull down of the auto-identify output 442. Upon the output of the first IC 431 being released, the pull-up circuit of the second IC 432 can pull the auto-identify input 481 of the second IC 432 "high". With the output of a third latch 462 of the auto-identify circuit 440 of the second IC 432 set "high" at power up, and the auto-identify input 481 of the second IC 432 being pulled "high", upon receiving the "next IC" (F_NIC) and "scanCLK" (F_SCN) signal at the auto-identify circuit 440 of the second IC 432, an output of a third latch 462 of the auto-identify circuit 440 of the second IC 432 can be set "high". The "high" output of the third latch 462 of the auto-identify circuit 440 of the second IC 432 can force an internal indicator of the second IC 432 to a "unique" state (ID_U) via a gate 460 of auto-identify circuit 440 of the second IC 432. In addition, passing of the "unique" state (ID_U) to the next IC can be prepared for as the "high" output of the third latch 462 also releases the auto-identify output 482 of the second IC 432 from being pulled "low" via the pull-down circuit 446 of the second IC 432. At this point, the second IC 432 can be individually addressed, tested and assigned a unique logical stack address for future use. In certain examples, the interaction between the pull-up circuit 445 of the second IC 432 and the pull-down circuit 446 of the first IC 431 is designed with a ratio such that if the pull-down circuit 446 is active, the pull-down circuit 346 can pull down the connection between stacked ICs harder than the corresponding pull-up circuit 445.

Pulsing the "next IC" and "scanCLK" signals can then pass the "unique" state (ID_U) to the IC located below the second IC 432 and the pattern can continue until the remaining ICs of the stack below the second IC 432 have been passed the "unique" state (ID_U) and assigned their own unique logical stack address for future use. Once all the ICs of the stack of ICs has been allocated and assigned a logical stack address, the external equipment can provide a command to blow a fuse, or provide some other more permanent flag, to indicate that each IC of the stack is to use die logical stack address as the primary, and optionally the only, address for responding to commands via the stack's address and command bus. In some examples, such a command can disable the auto-identify circuit of each IC of the stack. In some examples, such a command can render the internal indicator invalid for responding to information received via the stack's address and command bus.

Figure 5:
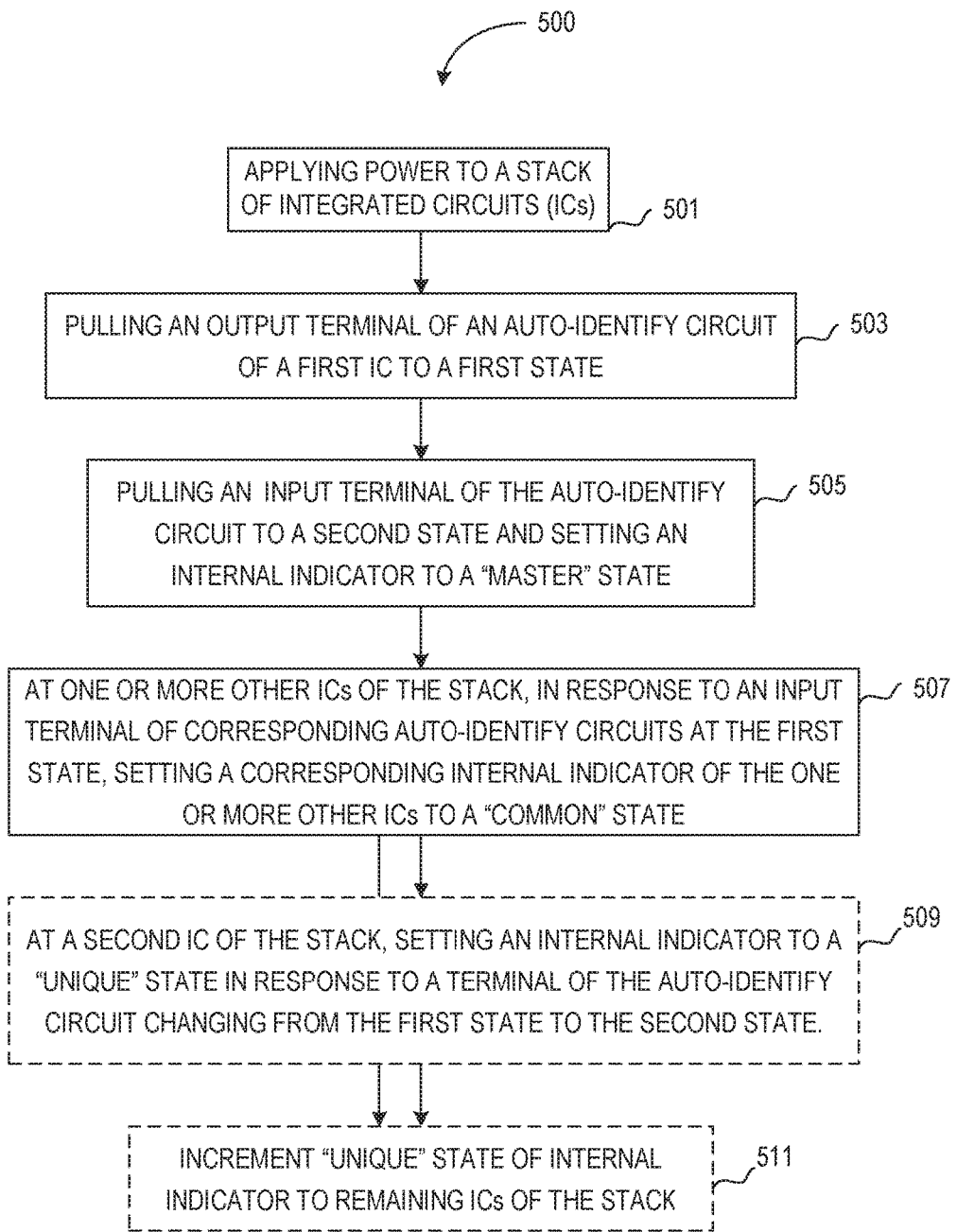
FIG. 5 illustrates generally a flowchart of an example method for powering up and configuring a stack of ICs using a single, auto-identify TSV location at each of the ICs.

FIG. 5 illustrates generally a flowchart of an example method 500 for powering up and configuring a stack of ICs using a single, auto-identify TSV location at each of the ICs. At 501, power can be applied to the stack of ICs. At 503, auto-identify logic of a plurality of the ICs can pull a single auto-identify output of the corresponding IC to a first state. At 505, at a first IC having a single auto-identify input pulled to a second state, the auto-identify circuit of the first IC can set an internal indicator to a "master" state in response to a power-up reset signal. At 507, at one or more remaining ICs of the stack, the auto-identify circuit of each of the one or more remaining ICs can set an internal indicator to a "common" state. At 509, optionally, at a second IC of the stack of ICs, the auto-identify circuit of the second IC can set an internal indicator to a "unique" state in response to a state of the single auto-identify input of the second IC changing from the first state to the second state. At 511, optionally, whether the "unique" state was assigned after a stable post power-up state or not, the "unique" state of the internal indicator can be incremented through the stack of ICs such that external equipment can set a unique stack address for each IC in the stack.

In some examples, an IC of the stack, sometimes a circuit at an end of the stack that does not have the auto-identify input of the auto-identify TSV structure connected to another IC of the stack can be identified and assigned the "master". Upon having the internal indication set to the "master" state, the IC can release a pull-down of the single auto-identify output of the single auto-identify TSV structure. In certain examples, releasing the pull-down of the single auto-identify output of one IC of the stack can allow an adjacent circuit to assume and be assigned the "unique" IC. In certain examples, the passing of the "unique" IC address can be initiated using a "next IC" signal received by the auto-identify circuit of the current "unique" IC.

It is understood, upon reading and understanding the above detailed description, that the logic states discussed above are specific to the illustrated circuits and that other logic circuits using other logic states to accomplish the functions discussed above are possible without departing from the scope of the present subject matter. It is also understood that the internal indicator discussed above takes the form of three binary signals and that other forms of an internal indicator are possible without departing from the scope of the present subject matter.

What is claimed is:

1. A method for automatically identifying integrated circuits of a stack of integrated circuits using a single thru-chip via location of the stack of integrated circuits, the method comprising:
   powering up a newly assembled stack of integrated circuits;
   pulling a single auto-identify output terminal of a plurality of the integrated circuits of the stack of integrated circuits to a first logic state;
   receiving a reset signal at an integrated circuit of the stack;
   in response to the reset signal and when a single, auto-identify input terminal of a first integrated circuit of the stack of integrated circuits is at a second logic level, setting an internal indicator of the first integrated circuit to a "master" state, and releasing the single auto-identify output terminal from the first logic state; and
   in response to the reset signal and when the single, auto-identify input terminal of the first integrated circuit of the stack of integrated circuits is at the first logic state, setting the internal indicator of the first integrated circuit to a "common" state.

2. The method of claim 1, wherein the internal indicator is a first stack address of the first integrated circuit of the stack of integrated circuits.

3. The method of claim 1, including when the single, auto-identify input terminal of the first integrated circuit of the stack of integrated circuits transition from the first logic state to a second logic state, setting the internal indicator of the first integrated circuit from a "common" state to a "unique" state.

4. The method of claim 1, wherein the state of the internal indicator of each integrated circuit of the stack of integrated circuits is a first stack address of the integrated circuit.

5. The method of claim 1, including receiving and storing a soft address at the first integrated circuit, the soft address indicative of a second stack address of the first integrated circuit.

6. The method of claim 5, including receiving a command to index a next chip at the first integrated circuit;
   setting the internal indicator of the first integrated circuit to the "common" state in response to the command to index to a next integrated circuit; and
   releasing the single auto-identify output terminal of the first integrated circuit from the first logic state.

7. The method of claim 1, including sequentially setting the internal indicator of each integrated circuit of the stack, except a master integrated circuit of the stack, to a "unique" state.

8. The method of claim 7, including, while the internal indicator of a particular integrated circuit of the stack of integrated circuits is in the "unique" state, responding at the particular integrated circuit to commands having an address corresponding to the internal indicator.

9. The method of claim 8, including, while the internal indicator of the particular integrated circuit of the stack of integrated circuits is in the "unique" state, receiving a command to establish a second stack address.

10. The method of claim 9, receiving a command at one or more of the integrated circuits of the stack of integrated circuits to use the second stack address as a primary address of the integrated circuit.

11. An integrated circuit configured to stack with a plurality of other integrated circuits, the integrated circuit comprising:
a single auto-identify input terminal;
a single auto-identify output terminal; and
control logic configured:
to receive a logic state on the single auto-identify input terminal;
to set an internal indicator to one of at least three states, and
to control a state of the single auto-identify output terminal in response to a power up condition or in response to a change in the logic state of the single auto-identify input terminal; and
wherein functions of the integrated circuit can be initiated using an address associated with the state of the internal indicator.

12. The integrated circuit of claim 11, wherein, in response to the power up condition, the control logic is configured to pull the auto-identify output to a first state.

13. The integrated circuit of claim 12, wherein in response to a power-up reset, and in response to the single auto-identify input in a second state, the control logic is configured to set the internal indicator to a "master" state.

14. The integrated circuit of claim 13, wherein in response to the power-up reset, and in response to the single auto-identify input in the first state, the control logic is configured to set the internal indicator to a "common" state.

15. The integrated circuit of claim 13, wherein in response to the internal indicator in the "master" state, the control logic is configured to release the pull down of the auto-identify ratioed output.

16. The integrated circuit of claim 11, wherein the control logic, in response to the change in logic state of the single auto-identify input, changes the internal indicator from a "common" state to a "unique" state.

17. The integrated circuit of claim 11, wherein a value of the internal indicator provides an address of the integrated circuit; and
wherein the control logic is configured to respond to commands when the address of the integrated circuit is received via a command/address bus of the integrated circuit.

18. The integrated circuit of claim 17, including a second internal indicator configured to store a second address of the integrated circuit.

19. The integrated circuit of claim 11, wherein the integrated circuit is a memory circuit.

20. A system comprising:
a plurality of integrated circuits arranged in a stack, each integrated circuit comprising:
a single auto-identify input terminal;
a single auto-identify output terminal; and
control logic configured to receive a logic state on the single auto-identify input terminal; to set an internal indicator to one of three states, and to control a state of the single auto-identify output terminal in response to a power up condition or to a change in the logic state of the single auto-identify input terminal; and
wherein the single auto-identify input terminal, or the single auto-identify output terminal, of each integrated circuit of the stack is coupled to the single auto-identify input terminal, or the single auto-identify output, of another integrated circuit of the stack.

21. The system of claim 20, wherein the stack of integrated circuits include a plurality of memory integrated circuits.

22. The system of claim 21, wherein the stack of integrated circuits include a memory interface integrated circuit.

* * * * *